(12) United States Patent
Su et al.

(10) Patent No.: US 12,360,461 B2
(45) Date of Patent: Jul. 15, 2025

(54) IDENTIFICATION OF HOT SPOTS OR DEFECTS BY MACHINE LEARNING

(71) Applicant: ASML NETHERLANDS B.V., Veldhoven (NL)

(72) Inventors: Jing Su, Fremont, CA (US); Yi Zou, Foster City, CA (US); Chenxi Lin, Newark, CA (US); Stefan Hunsche, Santa Clara, CA (US); Marinus Jochemsen, Veldhoven (NL); Yen-Wen Lu, Saratoga, CA (US); Lin Lee Cheong, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/744,091

(22) Filed: May 13, 2022

(65) Prior Publication Data

US 2022/0277116 A1 Sep. 1, 2022

Related U.S. Application Data

(63) Continuation of application No. 16/300,380, filed as application No. PCT/EP2017/059328 on Apr. 20, 2017, now Pat. No. 11,443,083.
(Continued)

(51) Int. Cl.
*G06T 7/00* (2017.01)
*G03F 7/00* (2006.01)
(Continued)

(52) U.S. Cl.
CPC .......... *G03F 7/705* (2013.01); *G03F 7/70525* (2013.01); *G06F 18/28* (2023.01);
(Continued)

(58) Field of Classification Search
CPC ...... G03F 7/705; G03F 7/70525; G06F 18/28; G06F 30/20; G06F 30/398; G06N 20/00;
(Continued)

(56) References Cited

U.S. PATENT DOCUMENTS 7,587,704 B2 9/2009 Ye et al.
8,402,397 B2 * 3/2013 Robles .................. G06F 30/398
716/54
(Continued)

FOREIGN PATENT DOCUMENTS

JP 2015201055 11/2015
KR 20130094836 8/2013
(Continued)

OTHER PUBLICATIONS

Wuu, Jen-Yi, Fedor G. Pikus, and Malgorzata Marek-Sadowska. "Efficient approach to early detection of lithographic hotspots using machine learning systems and pattern matching." In Design for Manufacturability through Design-Process Integration V, vol. 7974, pp. 243-250. SPIE, 2011. (Year: 2011).*
(Continued)

*Primary Examiner* — Carol W Chan
(74) *Attorney, Agent, or Firm* — Pillsbury Winthrop Shaw Pittman LLP

(57) ABSTRACT

Methods of identifying a hot spot from a design layout or of predicting whether a pattern in a design layout is defective, using a machine learning model. An example method disclosed herein includes obtaining sets of one or more characteristics of performance of hot spots, respectively, under a plurality of process conditions, respectively, in a device manufacturing process; determining, for each of the process conditions, for each of the hot spots, based on the one or more characteristics under that process condition, whether that hot spot is defective; obtaining a characteristic of each
(Continued)

of the process conditions; obtaining a characteristic of each of the hot spots; and training a machine learning model using a training set including the characteristic of one of the process conditions, the characteristic of one of the hot spots, and whether that hot spot is defective under that process condition.

20 Claims, 18 Drawing Sheets

Related U.S. Application Data

(60) Provisional application No. 62/335,544, filed on May 12, 2016.

(51) Int. Cl.
*G06F 18/28* (2023.01)
*G06F 30/20* (2020.01)
*G06F 30/398* (2020.01)
*G06N 20/00* (2019.01)
*G06V 10/772* (2022.01)

(52) U.S. Cl.
CPC ............ *G06F 30/20* (2020.01); *G06F 30/398* (2020.01); *G06N 20/00* (2019.01); *G06T 7/0004* (2013.01); *G06V 10/772* (2022.01); *G06T 2207/20081* (2013.01); *G06T 2207/30148* (2013.01); *G06V 2201/06* (2022.01)

(58) Field of Classification Search
CPC ......... G06T 7/0004; G06T 2207/20081; G06T 2207/30148; G06V 10/772; G06V 2201/06
See application file for complete search history.

(56) References Cited

U.S. PATENT DOCUMENTS

| | | | |
|---|---|---|---|
| 2007/0156379 A1* | 7/2007 | Kulkarni | H01L 21/67005 703/14 |
| 2007/0288219 A1* | 12/2007 | Zafar | G06T 7/0008 703/14 |
| 2009/0136121 A1 | 5/2009 | Nakagaki | |
| 2009/0157360 A1 | 6/2009 | Ye et al. | |
| 2010/0315614 A1 | 12/2010 | Hansen | |
| 2014/0301630 A1* | 10/2014 | Kulkarni | G06T 7/0004 382/149 |
| 2015/0227654 A1 | 8/2015 | Hunsche et al. | |
| 2015/0356233 A1 | 12/2015 | Fouquet | |
| 2016/0033877 A1 | 2/2016 | Smilde et al. | |
| 2016/0327605 A1* | 11/2016 | Pandev | H01L 22/20 |

FOREIGN PATENT DOCUMENTS

| | | |
|---|---|---|
| WO | 2007120280 | 10/2007 |
| WO | 2010059954 | 5/2010 |

OTHER PUBLICATIONS

Ding, Duo, Andres J. Torres, Fedor G. Pikus, and David Z. Pan. "High performance lithographic hotspot detection using hierarchically refined machine learning." In 16th Asia and South Pacific Design Automation Conference (ASP-DAC 2011), pp. 775-780. IEEE, 2011. (Year: 2011).*

Madkour, Kareem, Sarah Mohamed, Dina Tantawy, and Mohab Anis. "Hotspot detection using machine learning." In 2016 17th International Symposium on Quality Electronic Design (ISQED), pp. 405-409. IEEE, 2016. (Year: 2016).*

Ding, Duo, Xiang Wu, Joydeep Ghosh, and David Z. Pan. "Machine learning based lithographic hotspot detection with critical-feature extraction and classification." In 2009 IEEE international conference on IC design and technology, pp. 219-222. IEEE , 2009. (Year: 2009).*

Yu, Yen-Ting, Geng-He Lin, Iris Hui-Ru Jiang, and Charles Chiang. "Machine-learning-based hotspot detection using topological classification and critical feature extraction." In Proceedings of the 50th annual design automation conference, pp. 1-6. 2013. (Year: 2013).*

Wuu, Jen-Yi, Fedor G. Pikus, Andres Torres, and Malgorzata Marek-Sadowska. "Rapid layout pattern classification." In 16th Asia and South Pacific Design Automation Conference (ASP-DAC 2011), pp. 781-786. IEEE, 2011. (Year: 2011).*

International Search Report and Written Opinion issued in corresponding PCT Patent Application No. PCT/EP2017/059328, dated Jul. 21, 2017.

Wuu, Jen-Yi, et al.: "Metrics for Characterizing Machine Learning-Based Hotspot Detection Methods", IEEE, 12th International Symposium on Quality Electronic Design, Mar. 14, 2011.

"Defect Prediction", Research Disclosure, Mason Publications, vol. 604, No. 33, Jul. 18, 2014.

Korean Notice of Allowance issued in corresponding Korean Patent Application No. 10-2018-7035952, dated Aug. 31, 2020.

Translated version of JP2015201055 (2015).

* cited by examiner

IDENTIFICATION OF HOT SPOTS OR DEFECTS BY MACHINE LEARNING

This application is a continuation of pending U.S. patent application Ser. No. 16/300,380, filed on Nov. 9, 2018, which is the U.S. national phase entry of PCT patent application no. PCT/EP2017/059328, filed on Apr. 20, 2017, which claims the benefit of priority of U.S. Patent Application No. 62/335,544, filed on May 12, 2016, each of the foregoing applications is incorporated herein in its entirety by reference.

TECHNICAL FIELD

The description herein relates to lithographic apparatuses and processes, and more particularly to a tool and a method to predict hot spots and defects.

BACKGROUND

Manufacturing devices, such as semiconductor devices, typically involves processing a substrate (e.g., a semiconductor wafer) using a number of patterning processes and patterning apparatuses to form various features and multiple layers of the devices. Such layers and features are typically patterned using, e.g., deposition, lithography, etch, chemical-mechanical polishing, and ion implantation. Multiple devices may be patterned on a plurality of dies on a substrate and then separated into individual devices. A patterning process may involve a patterning step using a patterning apparatus, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes may be involved in the patterning process.

Metrology processes are used at various steps during a patterning process to monitor and control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), the measurements of the one or more characteristics may be used to alter one or more parameters of the patterning process such that further substrates manufactured by the patterning process have an acceptable characteristic(s).

A lithography apparatus can be used, for example, in a patterning process for the manufacture of integrated circuits (ICs) or other devices. In such a case, a patterning device (e.g., a mask) may contain or provide a circuit pattern corresponding to an individual layer of the device ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithography apparatus, one target portion at a time. In one type of lithography apparatus, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithography apparatus will have a reduction ratio M (e.g., 4), the speed F at which the substrate is moved will be a factor 1/M times that at which the projection beam scans the patterning device.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

SUMMARY

Disclosed herein is a method comprising: obtaining a characteristic of performance of a test pattern in a device manufacturing process; determining based on the characteristic whether the test pattern is a hot spot; and training, by a hardware computer system, a machine learning model using a training set comprising a sample whose feature vector comprises the characteristic and whose label is whether the test pattern is a hot spot.

According to an embodiment, the characteristic comprises a process window of the test pattern in the device manufacturing process. According to an embodiment, the characteristic comprise a characteristic of geometric shape of the test pattern, a density distribution of a pixelated image of the test pattern, a result of functional decomposition of the test pattern, fragmentation of the test pattern, diffraction order distribution of the test pattern, a Bossung curve of the test pattern, or a geometric characteristic of the test pattern. According to an embodiment, obtaining the characteristic comprises performing a simulation, performing metrology, or performing comparison of the characteristic to empirical data. According to an embodiment, determining whether the test pattern is a hot spot comprises comparing the characteristic to an overlapping process window of a group of patterns that comprises the test pattern.

Disclosed herein is a method comprising: obtaining a plurality of sets of characteristics of performance of a hot spot under a plurality of process conditions in a device manufacturing process, respectively; determining, for each of the process conditions, based on the set of characteristics under that process condition, whether the hot spot is defective; obtaining characteristics of each of the process conditions; and training, by a hardware computer system, a machine learning model using a training set comprising a plurality of samples, wherein each of the samples has a feature vector comprising characteristics of one of the process conditions and a label comprising whether the hot spot is defective under that process condition.

According to an embodiment, the characteristics of each of the process conditions comprise focus, dose, a reticle map, moving standard deviation (MSD), or a chemical-mechanical planarization (CMP) heat map. According to an embodiment, the sets of the characteristics of performance comprise a characteristic of an image of the hot spot produced by the device manufacturing process under the respective process condition. According to an embodiment, determining whether the hot spot is defective comprises comparing a characteristic of performance to a specification for the hot spot.

Disclosed herein is a method comprising: obtaining a plurality of sets of characteristics of performance of a plurality of hot spots, respectively, under a plurality of process conditions, respectively, in a device manufacturing process; determining, for each of the process conditions, for each of the hot spots, based on the characteristics under that process condition, whether that hot spot is defective; obtaining characteristics of each of the process conditions; obtaining characteristics of each of the hot spots; and training, by a hardware computer system, a machine learning model using a training set comprising a plurality of samples, wherein each of the sample has a feature vector comprising the characteristics of one of the process conditions and the characteristics of one of the hot spots, the feature vector further comprising a label comprising whether that hot spot is defective under that process condition.

According to an embodiment, the sets of the characteristics of the performance comprise a characteristic of an image of the respective hot spot produced by the device manufacturing process under the respective process conditions. According to an embodiment, obtaining the sets of characteristics of performance comprises performing simulation, performing metrology, or performing comparison of characteristics of performance to empirical data. According to an embodiment, determining whether the hot spot is defective comprises comparing a characteristic of performance of that hot spot to a specification for that hot spot. According to an embodiment, the characteristics of each of the process conditions comprise focus, dose, a reticle map, moving standard deviation (MSD), or a chemical-mechanical planarization (CMP) heat map. According to an embodiment, the characteristics of the hot spot comprise a characteristic of geometric shape of the hot spot, a density distribution of a pixelated image of the hot spot, a result of functional decomposition of the hot spot, fragmentation of the hot spot, diffraction order distribution of the hot spot, a Bossung curve for the hot spot, or a geometric characteristic of the hot spot.

Disclosed herein is a method comprising: simulating, by a hardware computer system, metrology data of hot spots in a design layout, based on one or more characteristics of the hot spots, a simulation model and one or more process conditions; clustering the hot spots into one or more clusters, based on one or more characteristics of the hot spots and the first simulated metrology data; and selecting representatives from the one or more clusters, respectively.

According to an embodiment, the representative of each of the clusters is a hot spot that is most likely to be defective within that cluster. According to an embodiment, the method further comprises: forming structures on a substrate from the representatives by subjecting the representatives to a fabrication process under a process condition; obtaining metrology data from the structures on the substrate; and obtaining a refined simulation model by tuning one or more parameters of the simulation model, based on the process condition and the metrology data. According to an embodiment, the method further comprises: simulating further metrology data of a group of patterns based on one or more characteristics of the patterns, the refined simulation model and one or more process conditions; obtaining experimental metrology data of the patterns; determining whether the patterns have any defect based on the experimental metrology data; and training, by a hardware computer, a classification model using a training set comprising the further simulated metrology data and whether the patterns have any defect.

Disclosed herein is a computer program product comprising a computer readable medium having instructions recorded thereon, the instructions when executed by a computer implementing any method herein.

DETAILED DESCRIPTION

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a pattern process parameter, e.g., a lithographic projection apparatus parameter, such that device fabrication results and/or processes (e.g., of lithography) have one or more desirable characteristics, such as higher accuracy of projection of a design layout on a substrate, larger process window, etc.

Figure 1:
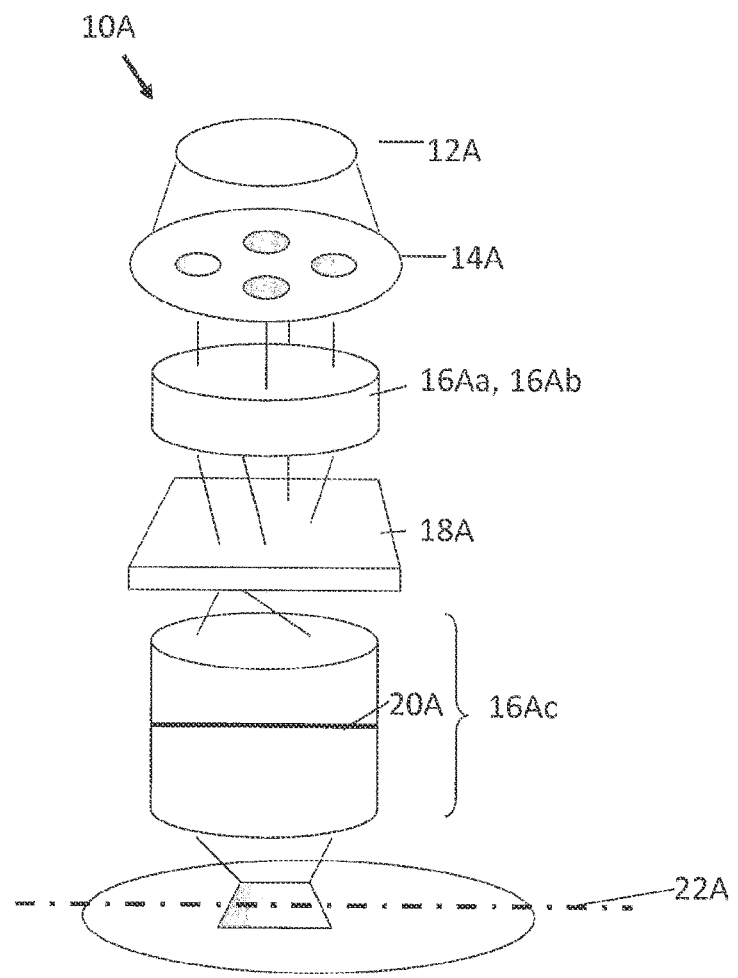
FIG. 1 is a block diagram of various subsystems of a lithography system.

As a brief introduction, FIG. 1 illustrates an exemplary lithographic projection apparatus 10A. Major components include illumination optics which define the partial coherence (denoted as sigma) and which may include optics 14A, 16Aa and 16Ab that shape radiation from a radiation source 12A, which may be a deep-ultraviolet excimer laser source or other type of source including an extreme ultra violet (EUV) source (as discussed herein, the lithographic projection apparatus itself need not have the radiation source); and optics 16Ac that project an image of a patterning device pattern of a patterning device 18A onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=$\sin(\theta_{max})$.

In a lithographic projection apparatus, projection optics direct and shape the illumination from a source via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes which occur during exposure, post-exposure bake (PEB) and development). Optical properties of the lithographic projection apparatus (e.g., properties of the source, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics.

Figure 2:
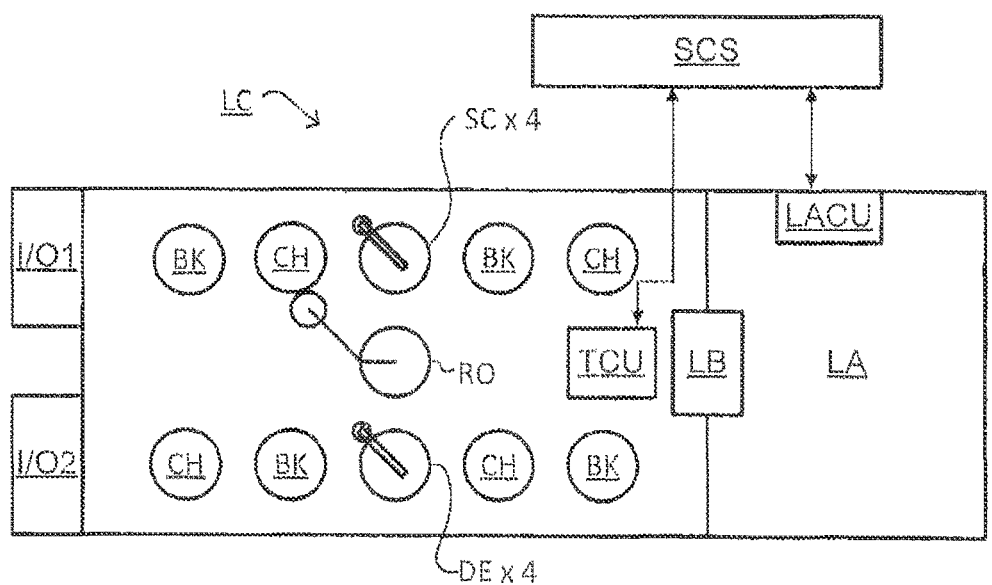
FIG. 2 schematically depicts an embodiment of a lithographic cell or cluster.

As shown in FIG. 2, the lithographic apparatus LA may form part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency. The lithographic cell LC may further comprises one or more etchers to etch the substrate and one or more measuring devices configured to measure a parameter of the substrate. The measuring device may comprise an optical measurement device configured to measure a physical parameter of the substrate, such as a scatterometer, a scanning electron microscope, etc. The measuring device may be incorporated in the lithographic apparatus LA. An embodiment of the invention may be implemented in or with the supervisory control system SCS and/or the lithographic control unit LACU. For example, data from the supervisory control system SCS and/or the lithographic control unit LACU may be used by an embodiment of the invention and one or more signals from an embodiment of the invention may be provided to the supervisory control system SCS and/or the lithographic control unit LACU.

Figure 3:
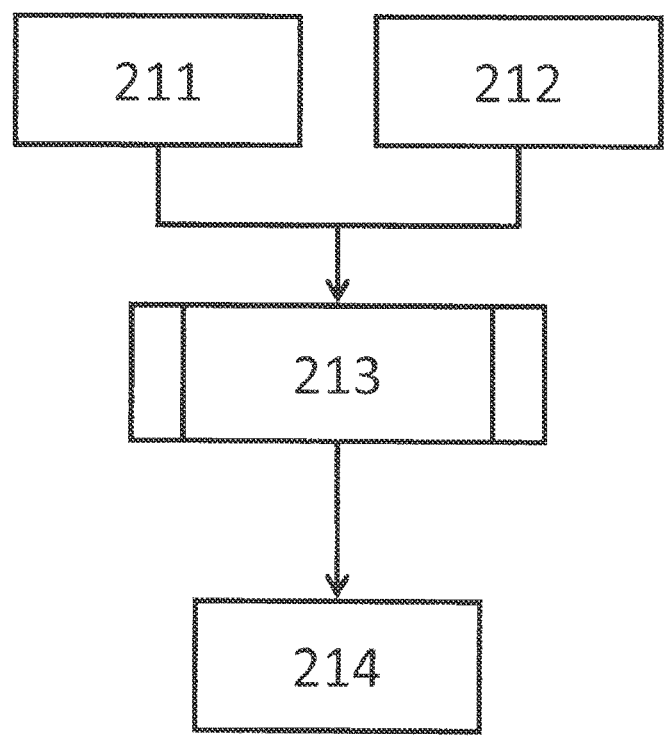
FIG. 3 schematically shows a method of predicting defects in a device manufacturing process.

FIG. 3 schematically depicts a method of predicting defects or hot spots in a device manufacturing process. A defect can be a systematic defect such as necking, line pull back, line thinning, out of specification CD, overlapping and/or bridging; a defect can also be a random defect such as one caused by deposition of a particle such as a dust particle. A systematic defect can be predicted and controlled. A defect can be in a resist image or an etch image (i.e., a pattern transferred to a layer of the substrate by etching using the resist thereon as a mask). A hot spot is a process window limiting pattern as explained hereafter. A computational or an empirical model 213 can be used to predict (e.g., predict the existence, location, type, shape, etc. of) defects or hot spots 214. The model 213 can take into account one or more parameters 211 (also referred to as process parameters) of the device manufacturing process and/or one or more layout (e.g., of the mask design pattern) parameters 212. The one or more process parameters 211 are parameters associated with the device manufacturing process but not with the layout. For example, the one or more process parameters 211 may include a characteristic of the source (e.g., intensity, pupil profile, etc.), a characteristic of the projection optics, dose, focus, a characteristic of the resist, a characteristic of development of the resist, a characteristic of post-exposure baking of the resist, and/or a characteristic of etching. The one or more layout parameters 212 may include a shape, size, relative location, and/or absolute location of one or more various features on a layout, and also overlapping of features on different layouts. In an empirical model, the image (e.g., resist image, etch image) is not simulated; instead, the empirical model predicts one or more defects or hot spots based on one or more correlations between the input and the one or more defects or hot spots. In a computational model, a portion or a characteristic of the image is calculated, and one or more defects or hot spots are identified based on the portion or the characteristic. For example, a line pull back defect may be identified by finding a line end too far away from its desired location and/or a bridging defect may be identified by finding a location where two lines undesirably join.

Various patterns on a patterning device may have respectively a different process window (i.e., a space of the processing parameters under which a pattern will be produced within specification). Examples of pattern specification that relate to potential systematic defects include checks for necking, line pull back, line thinning, out of specification CD, edge placement, overlapping, resist top loss, resist undercut and/or bridging. The process window of all the patterns on a patterning device or an area thereof may be obtained by merging (e.g., overlapping) process windows of each individual pattern. The process window of all the patterns on the patterning device or an area thereof thus may be called the overlapping process window (OPW). The boundary of the OPW contains boundaries of process windows of some of the individual patterns. In other words, these individual patterns limit the OPW. These patterns can be referred to as "hot spots" or "process window limiting patterns (PWLPs)," which are used interchangeably herein. When controlling a device manufacturing process, it is possible and economical to focus on the hot spots. When the hot spots are not defective, it is most likely that the all the patterns are not defective.

Figure 4:
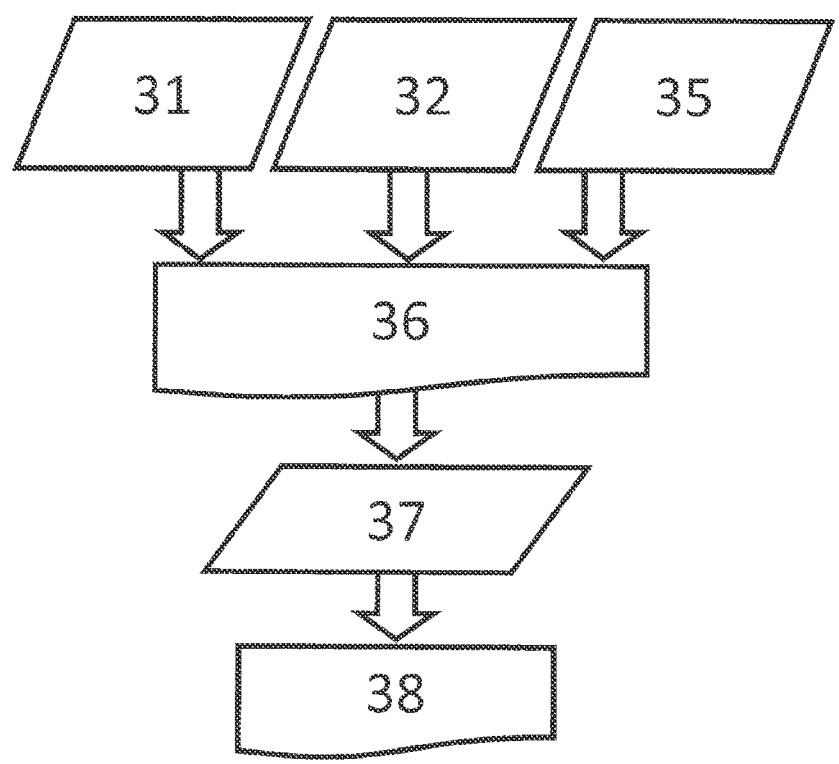
FIG. 4 schematically shows a block diagram of simulation models.

FIG. 4 illustrates an exemplary computational model. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout) of a design layout, which is the representation of an arrangement of features on or formed by a patterning device. An aerial image 36 can be simulated from the source model 31, the projection optics model 32 and the design layout model 35. A resist and/or etch image 38 can be simulated from the aerial image 36 using a resist and/or etch model 37. Simulation of lithography can, for example, predict contours and/or CDs in an image.

More specifically, it is noted that the source model 31 can represent the optical characteristics of the source that include, but not limited to, sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

An example of an empirical model is a machine learning model. Both unsupervised machine learning and supervised machine learning models may be used to predict one or more defects or hot spots. Without limiting the scope of the claims, applications of supervised machine learning algorithms are described below.

Supervised learning is the machine learning task of inferring a function from labeled training data. The training data is a set of training examples. In supervised learning, each example is a pair consisting of an input object (typically a vector) and a desired output value (also called the supervisory signal). A supervised learning algorithm analyzes the training data and produces an inferred function, which can be used for mapping new examples. An optimal scenario will allow the algorithm to correctly determine the class labels for unseen instances. This requires the learning algorithm to generalize from the training data to unseen situations in a "reasonable" way (see inductive bias).

Given a set of N training examples of the form $\{(x_1, y_1), (x_2, y_2), \ldots, (x_N, y_N)\}$ such that $x_i$ is the feature vector of the i-th example and $y_i$ is its label (i.e., class), a learning algorithm seeks a function g: X→Y, where X is the input space and Y is the output space. A feature vector is an n-dimensional vector of numerical features that represent some object. Many algorithms in machine learning require a numerical representation of objects, since such representations facilitate processing and statistical analysis. When representing images, the feature values might correspond to the pixels of an image, when representing text perhaps term occurrence frequencies. The vector space associated with these vectors is often called the feature space. The function g is an element of some space of possible functions G, usually called the hypothesis space. It is sometimes convenient to represent g using a scoring function f: X×Y→ℝ such that g is defined as returning the y value that gives the highest score:

$$g(x) = \arg\max_y f(x, y).$$

Let F denote the space of scoring functions.

Although G and F can be any space of functions, many learning algorithms are probabilistic models where g takes the form of a conditional probability model g(x)=P(y|x), or f takes the form of a joint probability model f(x,y)=P(x, y). For example, naive Bayes and linear discriminant analysis are joint probability models, whereas logistic regression is a conditional probability model.

There are two basic approaches to choosing f or g: empirical risk minimization and structural risk minimization. Empirical risk minimization seeks the function that best fits the training data. Structural risk minimization includes a penalty function that controls the bias/variance tradeoff.

In both cases, it is assumed that the training set contains a sample of independent and identically distributed pairs, $(x_i, y_i)$. In order to measure how well a function fits the training data, a loss function L: Y×Y→ℝ$^{\geq 0}$ can be defined. For training example $(x_i, y_i)$, the loss of predicting the value $\hat{y}$ is $L(y_i, \hat{y})$.

The risk R(g) of function g is defined as the expected loss of g. This can be estimated from the training data as $$R_{emp}(g) = \frac{1}{N}\sum_i L(y_i, g(x_i)).$$

Exemplary models of supervised learning include decision trees, ensembles (bagging, boosting, random forest), k-NN, linear regression, naive Bayes, neural networks, logistic regression, perceptron, support vector machine (SVM), relevance vector machine (RVM), and/or deep learning.

SVM is an example of supervised learning model, which analyzes data and recognizes patterns and can be used for classification and regression analysis. Given a set of training examples, each marked as belonging to one of two categories, a SVM training algorithm builds a model that assigns new examples into one category or the other, making it a non-probabilistic binary linear classifier. A SVM model is a representation of the examples as points in space, mapped so that the examples of the separate categories are divided by a clear gap that is as wide as possible. New examples are then mapped into that same space and predicted to belong to a category based on which side of the gap they fall on.

In addition to performing linear classification, SVMs can efficiently perform a non-linear classification using what is called kernel methods, implicitly mapping their inputs into high-dimensional feature spaces.

Kernel methods require only a user-specified kernel, i.e., a similarity function over pairs of data points in raw representation. Kernel methods owe their name to the use of kernel functions, which enable them to operate in a high-dimensional, implicit feature space without ever computing the coordinates of the data in that space, but rather by simply computing the inner products between the images of all pairs of data in the feature space. This operation is often computationally cheaper than the explicit computation of the coordinates. This approach is called the "kernel trick."

The effectiveness of SVM depends on the selection of kernel, the kernel's parameters, and soft margin parameter C. A common choice is a Gaussian kernel, which has a single parameter $\gamma$. The best combination of C and $\gamma$ is often selected by a grid search (also known as "parameter sweep") with exponentially growing sequences of C and $\gamma$, for example, $C \in \{2^{-5}, 2^{-4}, \ldots, 2^{15}, 2^{16}\}$; $\gamma \in \{2^{-15}, 2^{-14}, \ldots, 2^{4}, 2^{5}\}$.

A grid search is an exhaustive searching through a manually specified subset of the hyperparameter space of a learning algorithm. A grid search algorithm should be guided by some performance metric, typically measured by cross-validation on the training set or evaluation on a held-out validation set.

Each combination of parameter choices may be checked using cross validation, and the parameters with best cross-validation accuracy are picked.

Cross-validation, sometimes called rotation estimation, is a model validation technique for assessing how the results of a statistical analysis will generalize to an independent data set. It is mainly used in settings where the goal is prediction, and one wants to estimate how accurately a predictive model will perform in practice. In a prediction problem, a model is usually given a dataset of known data on which training is run (training dataset), and a dataset of unknown data (or first seen data) against which the model is tested (testing dataset). The goal of cross validation is to define a dataset to "test" the model in the training phase (i.e., the validation dataset), in order to limit problems like overfitting, give an insight on how the model will generalize to an independent data set (i.e., an unknown dataset, for instance from a real problem), etc. One round of cross-validation involves partitioning a sample of data into complementary subsets, performing the analysis on one subset (called the training set), and validating the analysis on the other subset (called the validation set or testing set). To reduce variability, multiple rounds of cross-validation are performed using different partitions, and the validation results are averaged over the rounds.

The final model, which can be used for testing and for classifying new data, is then trained on the entire training set using the selected parameters.

Figure 5A:
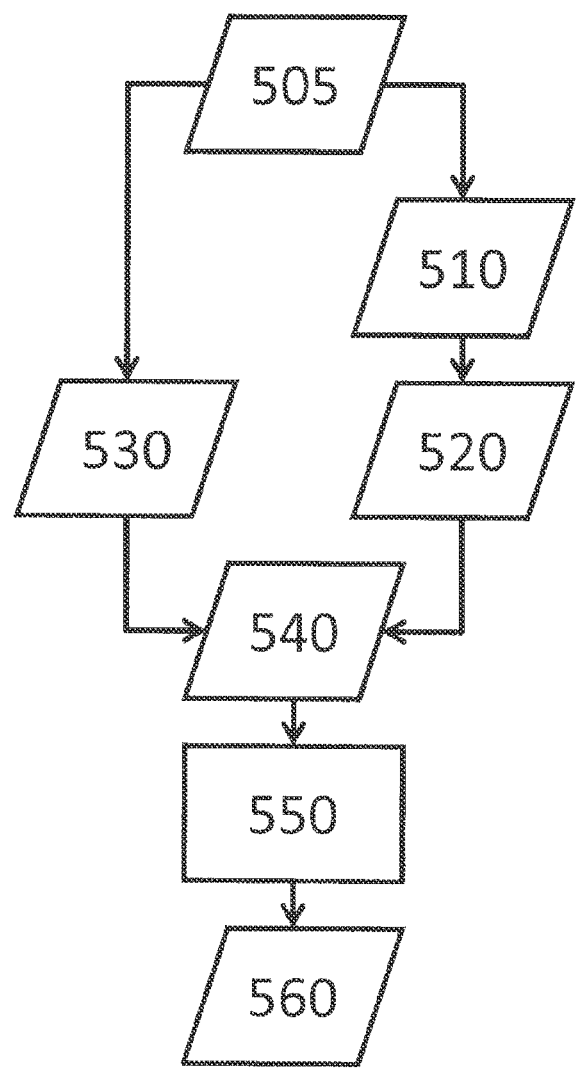
FIG. 5A and FIG. 5B schematically show flows for a method of identifying a hot spot using a machine learning model, according to an embodiment.
Figure 5B:
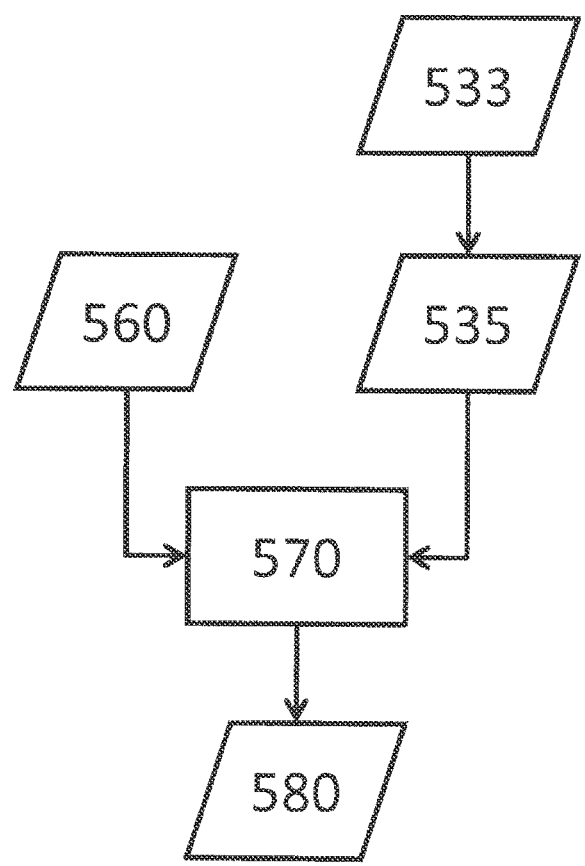

FIG. 5A and FIG. 5B schematically show flows for a method of identifying a hot spot using a machine learning model, according to an embodiment. FIG. 5A schematically shows a flow for training the machine learning model. One or more characteristics 510 of the performance of a test pattern 505 in a device manufacturing process are obtained. The one or more characteristics 510 may be a process window of the test pattern 505 in the device manufacturing process. The one or more characteristics 510 may be obtained by simulation, by metrology or by comparison to empirical data. A determination 520 is made based on the one or more characteristics 510, as to whether the test pattern 505 is a hot spot. For example, the determination 520 may be made by comparing the one or more characteristics 510 to an overlapping process window of a group of patterns including the test pattern 505. The determination 520 and the one or more characteristics 530 of the test pattern 505 are included in a training set 540 as a sample. The one or more characteristics 530 are the feature vector of the sample and the determination 520 is the label of the sample. In procedure 550, a machine learning model 560 is trained using the training set. Examples of the one or more characteristics 530 of the test pattern 505 may include a characteristic of the geometric shape of the test pattern 505, a density distribution of a pixelated image of the test pattern 505, a result of functional decomposition (e.g., Fourier transform, higher order local autocorrelation (HLAC)) of the test pattern 505 over a series of basis functions, fragmentation of the test pattern 505, and/or diffraction order distribution of the test pattern 505.

FIG. 5B schematically shows a flow for using the machine learning model 560 to predict whether a pattern 533 is a hot spot. One or more characteristics 535 of the pattern 533 are obtained. Examples of the one or more characteristics 535 of the pattern 533 may include a characteristic of the geometric shape of the pattern 533, a density distribution of a pixelated image of the pattern 533, a result of functional decomposition (e.g., Fourier transform, higher order local autocorrelation (HLAC)) of the pattern 533 over a series of basis functions, fragmentation of the pattern 533, and/or diffraction order distribution of the pattern 533. In procedure 570, the one or more characteristics 535 are provided as input into the machine learning model 560 and a prediction 580 of whether the pattern 533 is a hot spot is obtained as output from the machine learning model 560.

Figure 6A:
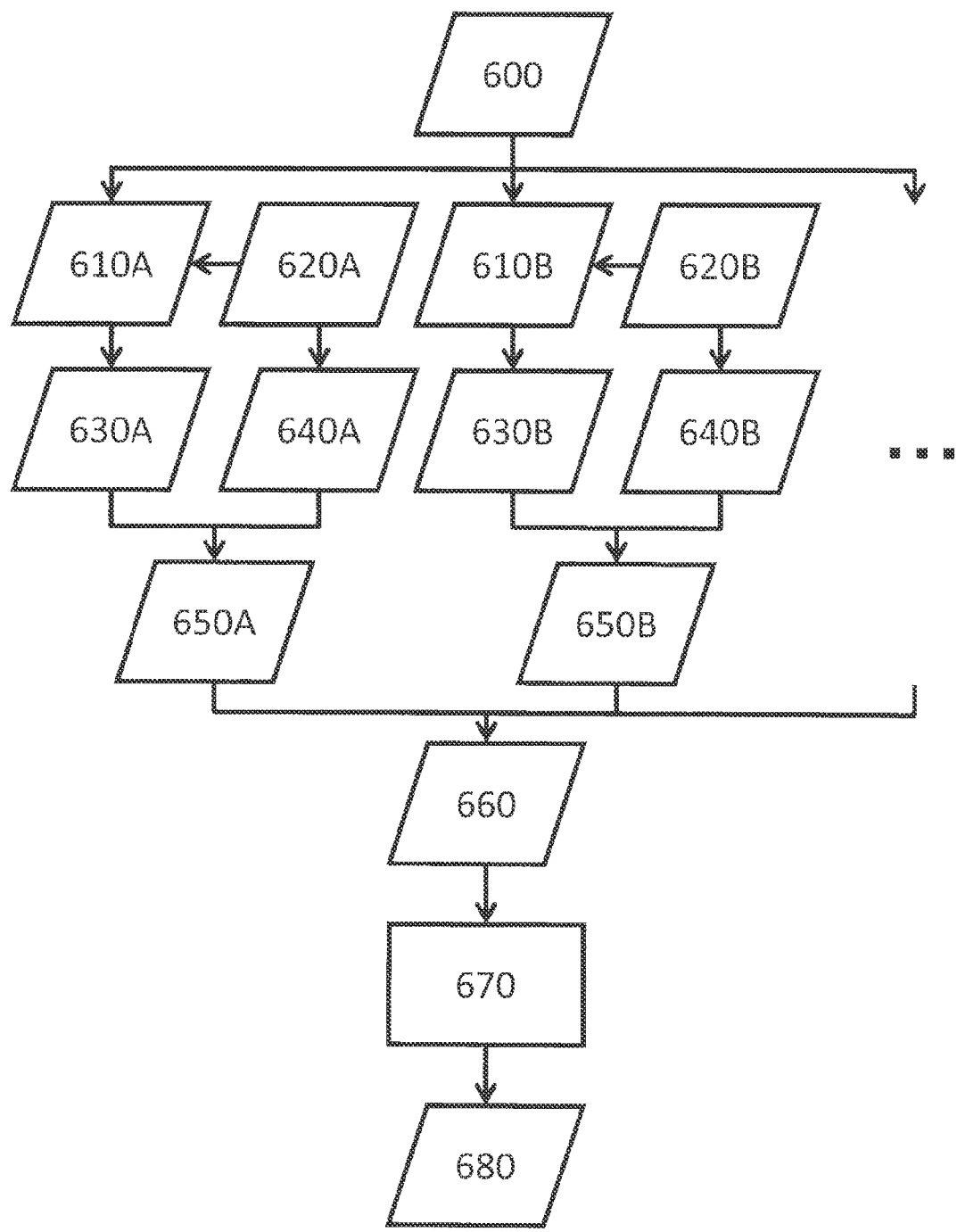
FIG. 6A and FIG. 6B schematically show flows for a method of predicting whether a hot spot is defective using a machine learning model, according to an embodiment.
Figure 6B:
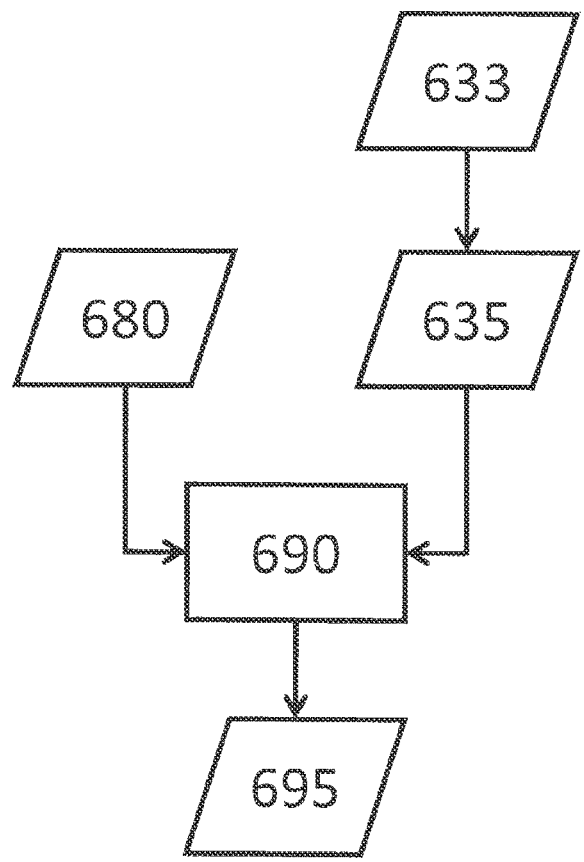

FIG. 6A and FIG. 6B schematically show flows for a method of predicting whether a hot spot is defective using a machine learning model, according to an embodiment. FIG. 6A schematically shows a flow for training the machine learning model. Characteristics 610A, 610B, . . . on the performance of the hot spot 600 under process conditions 620A, 620B, . . . , respectively, in a device manufacturing process are obtained. The characteristics 610A, 610B, . . . may be characteristics (e.g., CD) of an image of the hot spot 600 produced by the device manufacturing process under process conditions 620A, 620B, . . . , respectively. The characteristics 610A, 610B, . . . may be obtained by simulation, by metrology or by comparison to empirical data. Determinations 630A, 630B, . . . are made based on the characteristics 610A, 610B, . . . , as to whether the hot spot 600 is defective, respectively, under the process conditions 620A, 620B, . . . . For example, the determinations 630A, 630B, . . . may be made by comparing the characteristics 610A, 610B, . . . to a specification for the hot spot 600. Characteristics 640A, 640B, . . . of the process conditions 620A, 620B, . . . , respectively, are obtained. Examples of the characteristics 640A, 640B, . . . may include focus, dose, a reticle map, moving standard deviation (MSD), and/or a chemical-mechanical planarization (CMP) heat map. The characteristics 640A, 640B, . . . and the determinations 630A, 630B, . . . are included in a training set 660 as samples 650A, 650B, . . . , respectively. In procedure 670, a machine learning model 680 is trained using the training set 660.

FIG. 6B schematically shows a flow for using the machine learning model 680 to predict whether the hot spot 600 is defective under a given process condition 633. One or more characteristics 635 of the process condition 633 are obtained. Examples of the one or more characteristics 635 may include focus, dose, a reticle map, moving standard deviation (MSD), and/or a chemical-mechanical planarization (CMP) heat map. In procedure 690, the one or more characteristics 635 are provided as input into the machine learning model 680 and a prediction 695 of whether the hot spot 600 is defective under the process condition 633 is obtained as output from the machine learning model 680.

Figure 7A:
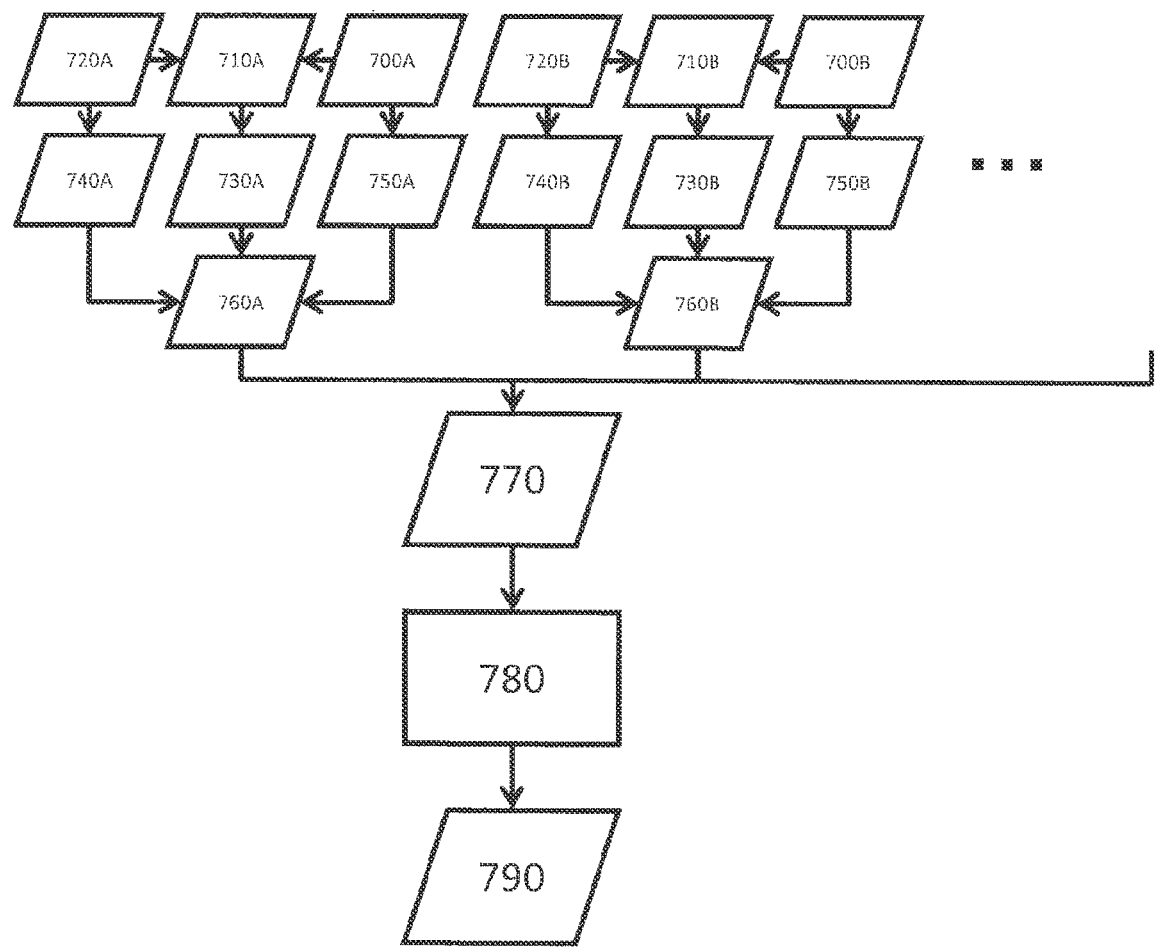
FIG. 7A and FIG. 7B schematically show flows for a method of predicting whether any hot spot is defective using a machine learning model, according to an embodiment.
Figure 7B:
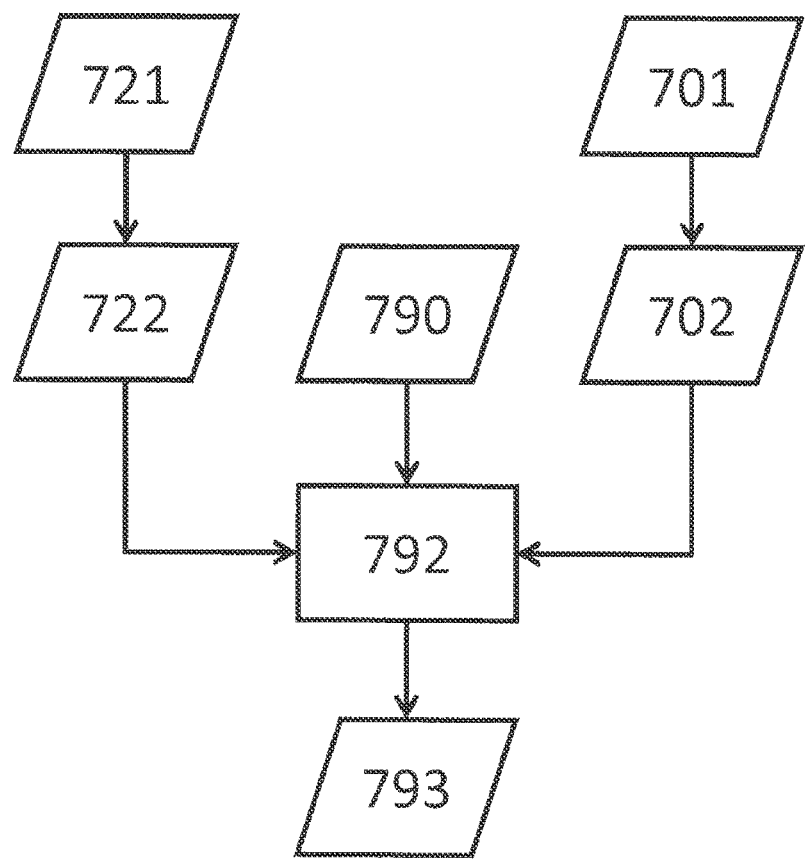

FIG. 7A and FIG. 7B schematically show flows for a method of predicting whether a hot spot is defective using a machine learning model, according to an embodiment. FIG. 7A schematically shows a flow for training the machine learning model. Characteristics 710A, 710B, . . . of the performance of hot spots 700A, 700B, . . . , respectively, under process conditions 720A, 720B, . . . , respectively, in a device manufacturing process are obtained. The characteristics 710A, 710B, . . . may be characteristics (e.g., CD) of an image of the hot spots 700A, 700B, respectively, produced by the device manufacturing process under process conditions 720A, 720B, . . . , respectively. The characteristics 710A, 710B, . . . may be obtained by simulation, by metrology or by comparison to empirical data. Determinations 730A, 730B, . . . are made based on the characteristics 710A, 710B, . . . , as to whether the hot spots 700A, 700B are defective, respectively, under the process conditions 720A, 720B, . . . , respectively. For example, the determinations 730A, 730B, . . . may be made by comparing the characteristics 710A, 710B, . . . to a specification for the hot spots 700A, 700B, . . . , respectively. Characteristics 740A, 740B, . . . of the process conditions 720A, 720B, . . . , respectively, are obtained. Examples of the characteristics 740A, 740B, . . . may include focus, dose, a reticle map, moving standard deviation (MSD), and/or a chemical-mechanical planarization (CMP) heat map. Characteristics 750A, 750B, . . . of the hot spots 700A, 700B, . . . , respectively are determined. Examples of the characteristics 750A, 750B, . . . of the hot spots 700A, 700B, . . . may include a characteristic of the geometric shape of the hot spots 700A, 700B, . . . , a density distribution of a pixelated image of the hot spots 700A, 700B, . . . , results of functional decomposition (e.g., Fourier transform, higher order local autocorrelation (HLAC)) of the hot spots 700A, 700B, . . . over a series of basis functions, fragmentation of the hot spots 700A, 700B, . . . , and/or diffraction order distribution of the hot spots 700A, 700B, . . . . Other examples of the characteristics 750A, 750B, . . . may include a Bossung curve and one or more geometric characteristics such as CD, image log slope, normalized image log slope, etc. The characteristics 750A, 750B, . . . may be obtained by simulation, e.g., directly or measured from a simulated image of the hot spots 700A, 700B, . . . . The characteristics 740A, 740B, . . . , the determinations 730A, 730B, . . . , and the characteristics 750A, 750B, . . . are included in a training set 770 as samples 760A, 760B, . . . , respectively. In procedure 780, a machine learning model 790 is trained using the training set 770.

FIG. 7B schematically shows a flow for using the machine learning model 790 to predict whether a hot spot 701 is defective under a given process condition 721. One or more characteristics 722 of the process condition 721 are obtained. Examples of the characteristic 722 of the pattern may include focus, dose, a reticle map, moving standard deviation (MSD), and/or a chemical-mechanical planarization (CMP) heat map. One or more characteristics 702 of the hot spot 701 are obtained. Examples of the characteristic 702 may include a characteristic of the geometric shape of the hot spot 701, a density distribution of a pixelated image of the hot spot 701, a result of functional decomposition (e.g., Fourier transform, higher order local autocorrelation (HLAC)) of the hot spot 701 over a series of basis functions, fragmentation of the hot spot 701, and/or a diffraction order distribution of the hot spot 701. In procedure 792, the characteristics 702 and characteristics 722 are provided as input into the machine learning model 790 and a prediction 793 of whether the hot spot 701 is defective under the process condition 721 is obtained as output from the machine learning model 790.

Figure 8A:
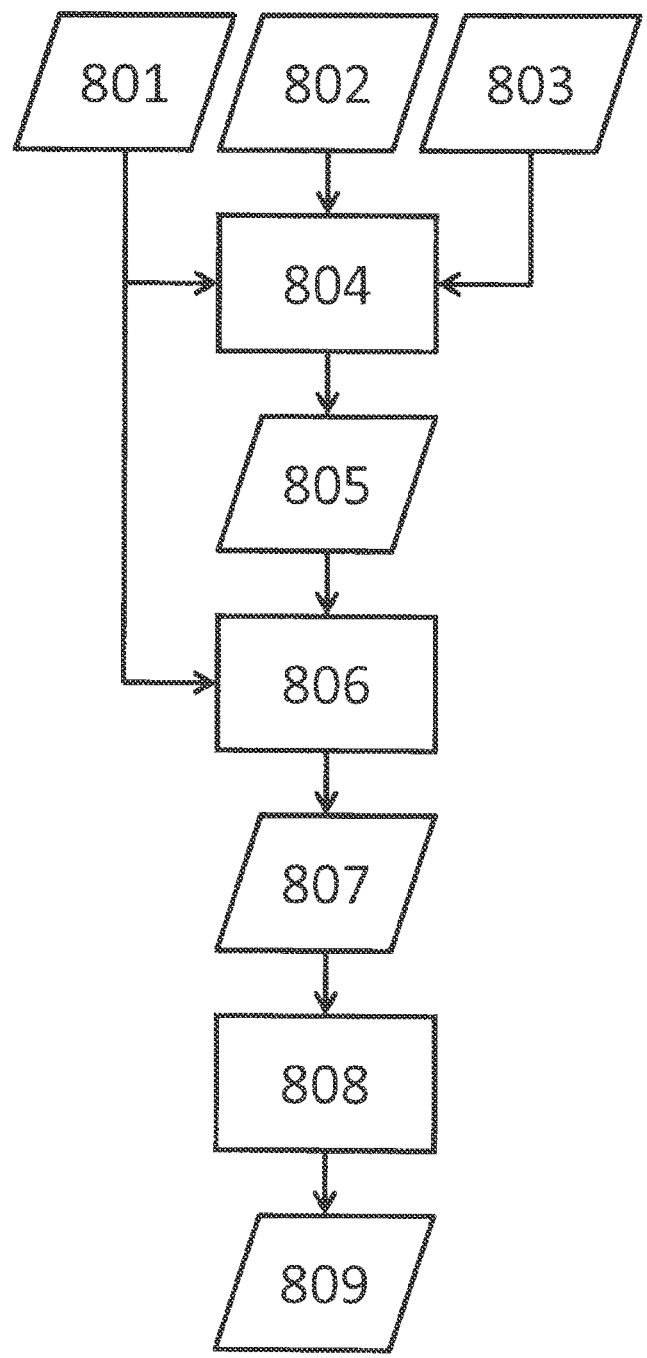
FIGS. 8A, 8B, 8C and 8D schematically show a flow for a method of predicting whether a pattern is defective using a machine learning model, according to an embodiment.

FIGS. 8A, 8B, 8C and 8D schematically show a flow for a method of predicting whether a pattern is defective using a machine learning model, according to an embodiment. FIG. 8A schematically shows a flow for selecting representative hot spots. Metrology data 805 of hot spots 801 in a design layout is simulated in procedure 804 based on one or more characteristics of the hot spots 801, a simulation model 802 and one or more process conditions 803. The hot spots 801 are clustered in procedure 806 into one or more clusters 807, based on the one or more characteristics of the hot spots 801 and their simulated metrology data 805. In procedure 808, a representative hot spot 809 is selected from each of the clusters 807. For example, the representative of each cluster may be the hot spot that is most likely to be defective within the cluster.

Figure 8B:
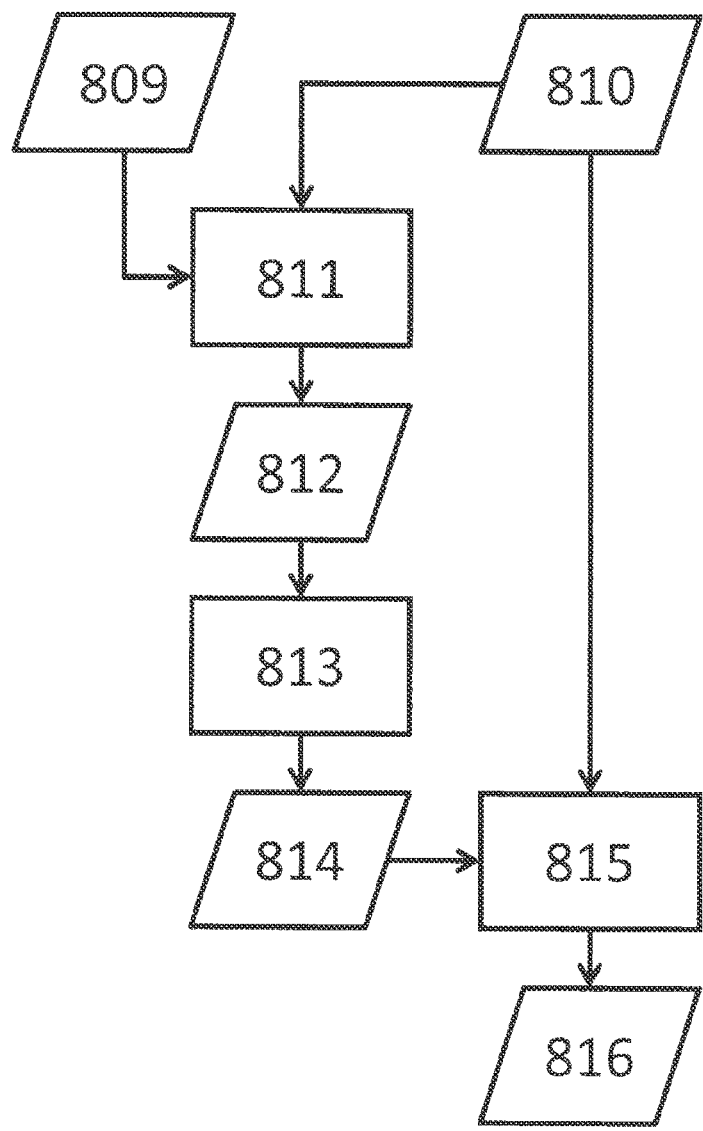

FIG. 8B schematically shows a flow for refining the simulation model 802 using the representatives 809 of the hot spots 801. The representatives 809 undergo a fabrication process 811 under a process condition 810 to form one or more structures 812 on a substrate. Metrology data 814 is obtained for the one or more structures 812 on the substrate by a metrology procedure 813. In procedure 815, a regression model is used to tune parameters of the simulation model 802 based on the process condition 810 and the metrology data 814. A refined simulation model 816 is obtained from the regression model.

Figure 8C:
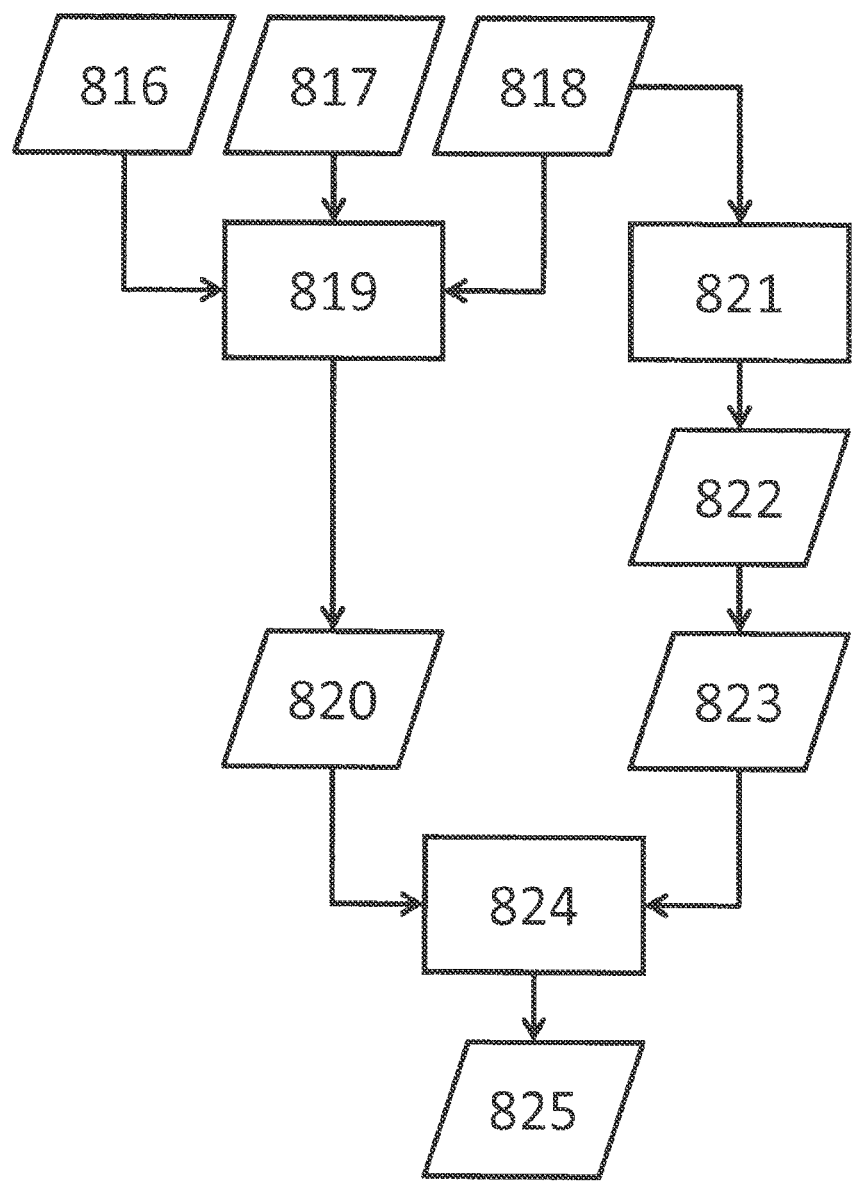

FIG. 8C schematically shows a flow for obtaining a classification model for defect prediction, from the refined simulation model 816. Simulated metrology data 820 of a group of patterns 818 are simulated in procedure 819 based on one or more characteristics of the patterns 818, the refined simulation model 816 and one or more process conditions 817. Experimental metrology data 822 is obtained by a metrology procedure 821 performed on the patterns 818. A determination 823 of whether the patterns 818 have any defect is made based on the experimental metrology data 822. In procedure 824, the simulated metrology data 820 and the determination 823 are used as a training set to train a classification model 825.

Figure 8D:
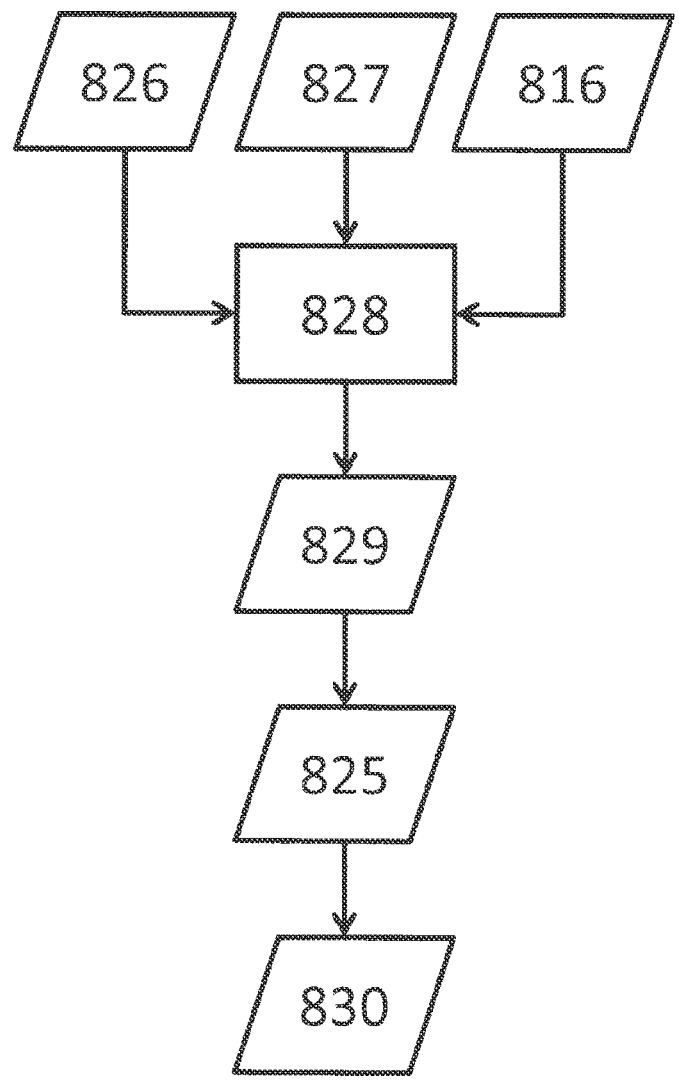

FIG. 8D schematically shows a flow for prediction whether a pattern 826 is a defect using the classification model 825. In a procedure 828, simulated metrology data 829 of the pattern 826 is simulated based on one or more characteristics of the pattern 826, the refined simulation model 816 and a process condition 827. The simulated metrology data 829 is used as input to the classification model 825. A prediction 830 of whether the pattern 826 is a defect is obtained as an output from the classification model 825.

So, in an embodiment, there is provided defect prediction using machine learning. This method can have various use cases. In an example use case, hot spots can be found by using machine learning. That is, machine learning can find out a hot spot for a given layout. In the training stage, for a given pattern on the layout, a pattern is determined that it is a hotspot by using simulation and/or experiment or using problematic patterns from a pattern library. Then, the original or variant of the pattern is used as input and the determination result as output to train a machine learning model. If the original pattern image is used as input, there are several ways to decompose the image for use in a feature vector by, for example, pixelating the image and converting the pixelated density distribution into a feature vector, and/or decomposing the image using some basis method, such as high order local autocorrelation (HLAC), and/or fragment each polygon in the pattern into several fragments and for each fragment construct a feature vector by considering all its context fragments. If a variant of the pattern is used as input for the feature vector, the variant can be, for example, a diffraction order distribution of the pattern, an intensity distribution of the pattern in the frequency domain, and/or a simulated image.

In a further example use case, defect prediction can be made using a limited number of hot spots. In this case, a verification of each hot spot under different process conditions can be performed using metrology data (e.g., using rSEM/CDSEM/e-beam inspection). Then, the process condition variables (e.g., from the lithographic apparatus and/or metrology, such as focus, effective dose (after development, after etch), a reticle map, MSD, and/or a CMP heat map) are used as input for the feature vector and the verification result (e.g., yes/no, or defect probability, or defect size) are used as output for the feature vector to train a machine learning model (e.g., classification or regression). For one or more of the hot spots, a model can be built, which is later used to do defect prediction. In an embodiment, such a method can be extended to a realtime mode, which means verification data is continuously collected and the model is updated in time by using an online learning technique). In this case, the input variable dimension may be only one or two. Or, the verification data can be used to fit a curve/surface and then use the curve/surface to do prediction.

In a further use case, defect prediction can be made using a large number of hot spots. In this case, verification of all the hotspots is impractical. So, a combination of experimental data with design data and/or simulation data can be used to build a defect prediction model. In an embodiment, the machine learning input has three parts: design data extracted from the hot spot patterns, simulation data for the hot spot patterns, and process condition variables (e.g., from a lithographic apparatus or metrology). The design data can be extracted using, for example, methods described above for the use case of finding hot spots using machine learning. The simulation data can be in different formats: 1) CD, area, ILS, slope of a Bossung curve, etc. obtained in simulation at corresponding process condition, 2) a hot spot image simulated at corresponding process condition, 3) a simulated Bossung curve as a figure, and/or 4) a parameterized Bossung curve (e.g., the fitting parameters of a fitting function like polynomial function or Gaussian function). Adding design data and/or simulation data has two functions: differentiating those hot spot patterns used in the training stage and predicting those "unseen" hot spot patterns in the test stage.

Any machine learning algorithm (SVM, logistic regression, KNN, AdaBoost, etc.) that gives good prediction result can be used. The output of the machine learning can be Y/N, defect probability, and/or defect size.

Thus, in an embodiment, machine learning can be used to enable defect prediction, wherein the machine learning can use design data only to do hot spot identification, the machine learning can use experimental data only to do defect prediction and/or process window and/or yield monitoring, the machine learning can use a combination of experimental data and design data/simulation data to do defect prediction, and/or the machine learning can use design data/simulation data to build an initial model and incrementally add more experimental data into prediction by using online learning techniques.

In an embodiment, hotspots are identified, and the CD vs focus and dose at specific conditions are generated. Then, a prediction module combines this information with process information (e.g., from a lithographic apparatus) to predict the probability and/or existence of a defect after printing for the hotspots. This information is then passed on to a verification module, where a sub-set of the predicted defects can be inspected (e.g., using a general metrology tool such as CD-SEM, review SEM, etc.). In an embodiment, the prediction capability of the prediction module uses a hybrid defect prediction model enabled by machine learning. This model can be a classification and/or a regression model. It is a hybrid in the sense that multiple simulation data (e.g., a plurality of characteristics, selected from, e.g., CD, CD-dose slope, CD-focus slope and/or ILS) are combined with a trained machine learning algorithm to compute the probability and/or existence of a defect on the substrate. During a setup phase for the model, the model is initially trained using, for example, a process map of a setup substrate, measured data from a verification module (e.g., over a focus and/or dose range for a subset of hotspots) and simulated information for the above-mentioned hot spots. The trained model can then be used as an initial model for prediction modeling in, e.g., a high-volume manufacturing (HVM) phase. Metrology data (much sparser than during the setup phase) can be continuously generated from exposed substrates and used to periodically improve the model prediction when sufficient data points have been collected. Thus, the model can be adaptive in the sense that the model is able to continuously learn, extrapolate and improve its prediction capability. As will be appreciated, this approach can be extended to monitoring hot spots on substrates undergoing further processes after the lithography step, such as etching and pattern transfer. Thus, in an embodiment, there is provided a combination of simulation data with a regression and/or classification algorithm to determine a prediction and/or existence of a defect on a substrate that occurs during the patterning process.

The concepts and results disclosed herein may be used to calibrate or modify any simulation or mathematical model of the patterning process, such as one that simulates or models any generic imaging system for imaging sub-micron features. The concepts and results disclosed herein may be used to control the patterning process by, for example, modifying one or more design variables. The concepts and results disclosed herein may be used to design the patterning process by, for example, modifying one or more design variables. The concepts and results disclosed herein may be used to monitor the patterning process by, for example, identifying whether one or more defects have occurred or whether one or more defects are likely to occur. The concepts and results disclosed herein may be used to create or calibrate a model predictive control system that, for example, regulates defects.

Figure 9:
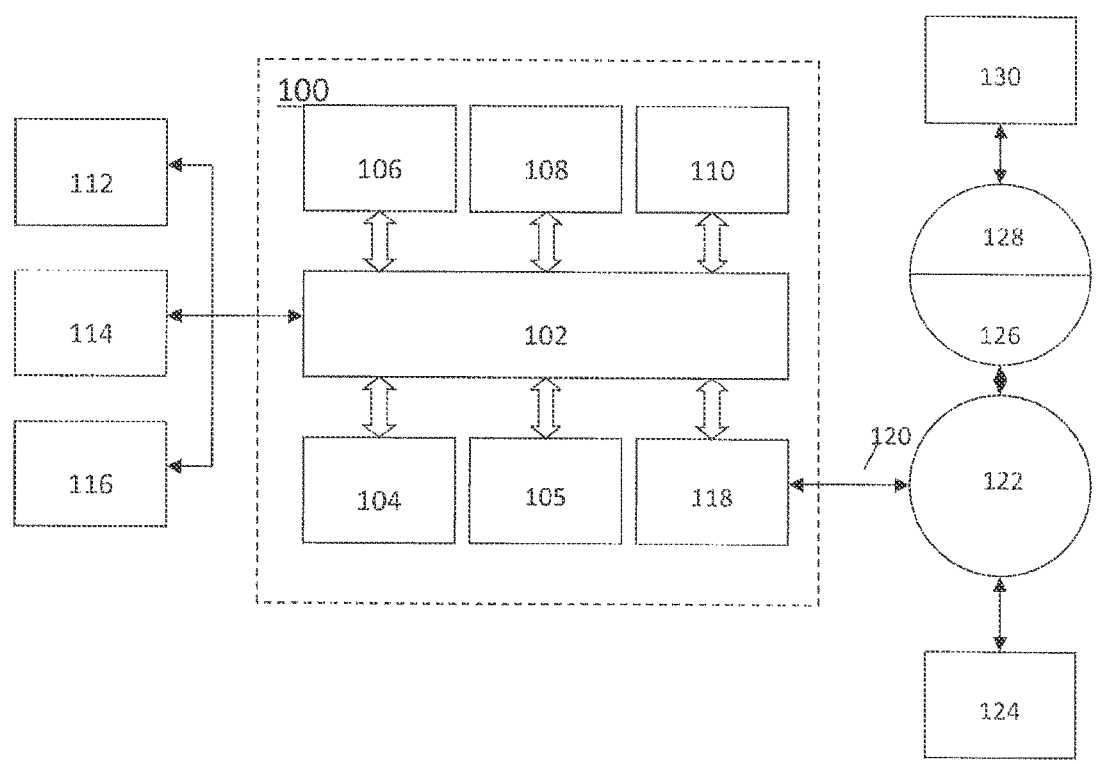
FIG. 9 is a block diagram of an example computer system.

FIG. 9 is a block diagram that illustrates a computer system 100 which can implement methods and/or flows disclosed herein. The computer system Computer system 100 includes a bus 102 or other communication mechanism to communicate information, and a processor 104 (or multiple processors 104 and 105) coupled with bus 102 to process information. Computer system 100 may also include a main memory 106, such as a random access memory (RAM) or other dynamic storage device, coupled to bus 102 to store and/or supply information and instructions to be executed by processor 104. Main memory 106 may be used to store and/or supply temporary variables or other intermediate information during execution of instructions to be executed by processor 104. Computer system 100 may further include a read only memory (ROM) 108 or other static storage device coupled to bus 102 to store and/or supply static information and instructions for processor 104. A storage device 110, such as a magnetic disk or optical disk, may be provided and coupled to bus 102 to store and/or supply information and instructions.

Computer system 100 may be coupled via bus 102 to a display 112, such as a cathode ray tube (CRT) or flat panel or touch panel display, to display information to a computer user. An input device 114, including alphanumeric and other keys, may be coupled to bus 102 to communicate information and command selections to processor 104. Another type of user input device may be cursor control 116, such as a mouse, a trackball, or cursor direction keys, to communicate direction information and command selections to processor 104 and to control cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a method described herein may be performed by computer system 100 in response to processor 104 executing one or more sequences of one or more instructions. In an embodiment, the computer system 100 can be part of a lithographic apparatus, part of a metrology system, a stand-alone system is connected to the lithographic apparatus and/or metrology system, etc.

Such instructions may be contained in main memory 106 and may be read into main memory 106 from another computer-readable medium, such as storage device 110. Execution of the sequences of instructions contained in main memory 106 causes processor 104 to perform the process steps described herein. One or more processors in a multi-processing arrangement may be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a disk or memory of a remote computer. The remote computer can load the instructions into its dynamic memory and send the instructions over a communications path. Computer system 100 can receive the data from the path and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may include a communication interface 118 coupled to bus 102. Communication interface 118 provides a two-way data communication coupling to a network link 120 that is connected to a network 122. For example, communication interface 118 may provide a wired or wireless data communication connection. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through network 122 to a host computer 124 or to data equipment operated by an Internet Service Provider (ISP) 126. ISP 126 in turn provides data communication services through the worldwide packet data communication network, now commonly referred to as the "Internet" 128. Network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, network 122 and communication interface 118. One such downloaded application may provide for the code to implement a method herein, for example. The received code may be executed by processor 104 as it is received, and/or stored in storage device 110, or other non-volatile storage for later execution. In this manner, computer system 100 may obtain application code in the form of a carrier wave.

Figure 10:
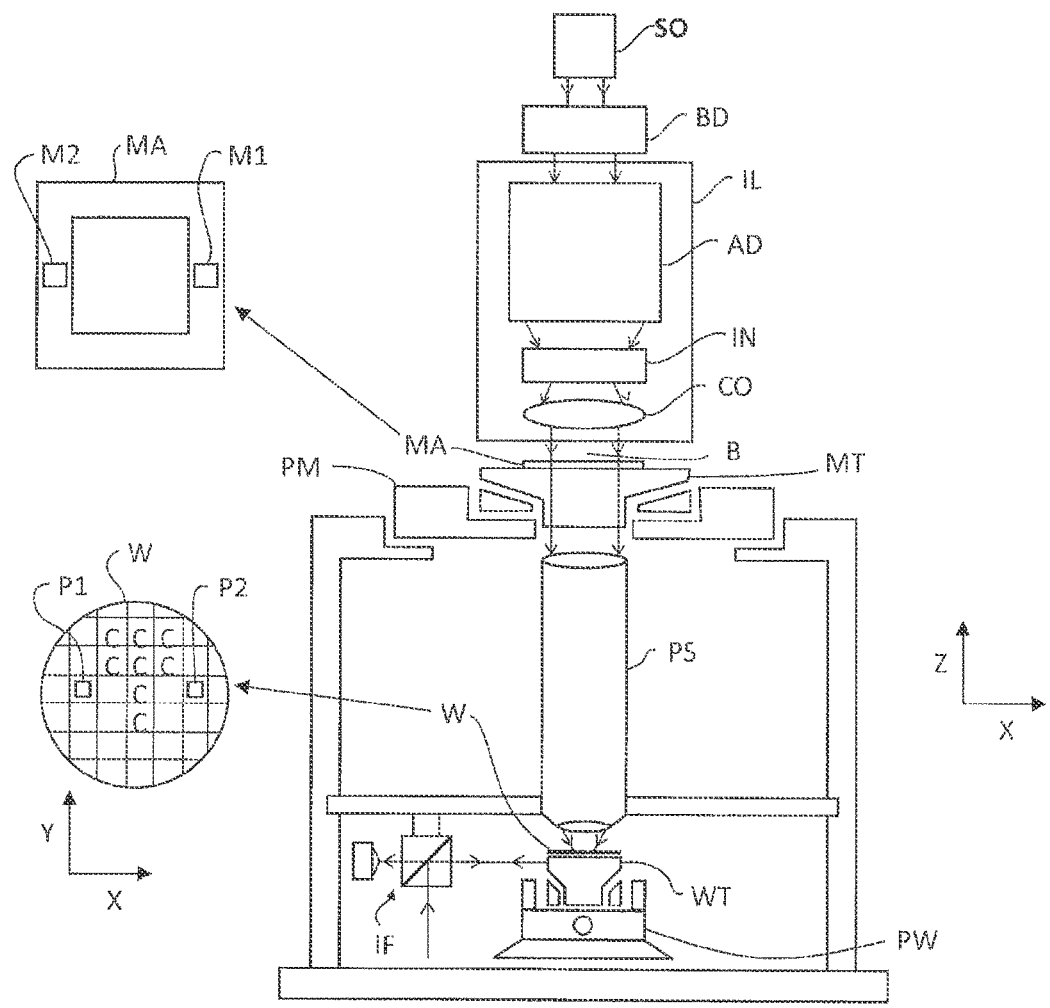
FIG. 10 is a schematic diagram of a lithographic projection apparatus.

FIG. 10 schematically depicts an exemplary lithographic projection apparatus. The apparatus comprises:

an illumination system IL, to condition a beam B of radiation. In this particular case, the illumination system also comprises a radiation source SO;

a first object table (e.g., mask table) MT provided with a patterning device holder to hold a patterning device MA (e.g., a reticle), and connected to a first positioner PM to accurately position the patterning device with respect to item PS;

a second object table (substrate table) WT provided with a substrate holder to hold a substrate W (e.g., a resist-coated silicon wafer), and connected to a second positioner PW to accurately position the substrate with respect to item PS;

a projection system PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed a conditioner, such as a beam expander. The illuminator IL may comprise an adjuster AD configured to set the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 10 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors BD); this latter scenario is often the case when the source SO is an excimer laser (e.g., based on KrF, ArF or $F_2$ lasing).

The beam B subsequently intercepts the patterning device MA, which is held on a patterning device table MT. Having traversed the patterning device MA, the beam B passes through the projection system PS, which focuses the beam B onto a target portion C of the substrate W. With the aid of the second positioner PW (and interferometer IF), the substrate table WT can be moved accurately, e.g. so as to position different target portions C in the path of the beam B. Similarly, the first positioner PM can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 10.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features.

Figure 11:
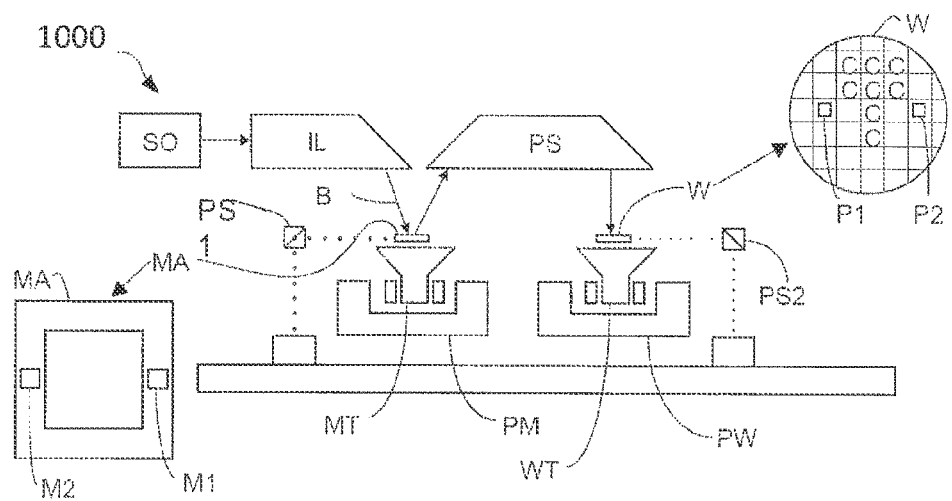
FIG. 11 is a schematic diagram of another lithographic projection apparatus.

FIG. 11 schematically depicts another exemplary lithographic projection apparatus 1000. The lithographic projection apparatus 1000 includes:

a source collector module SO an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the patterning device may have a multi-layer reflector comprising, for example, a multi-stack of molybdenum and silicon. In one example, the multi-stack reflector has a 40 layer pairs of molybdenum and silicon. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 11, the illuminator IL receives an extreme ultra violet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 11, to provide the laser beam to excite the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously in a given direction (the so-called "scan direction") while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Further, the lithographic apparatus may be of a type having two or more tables (e.g., two or more substrate table, two or more patterning device tables, and/or a substrate table and a table without a substrate). In such "multiple stage" devices the additional tables may be used in parallel, or preparatory steps may be carried out on one or more tables while one or more other tables are being used for exposures.

Figure 12:
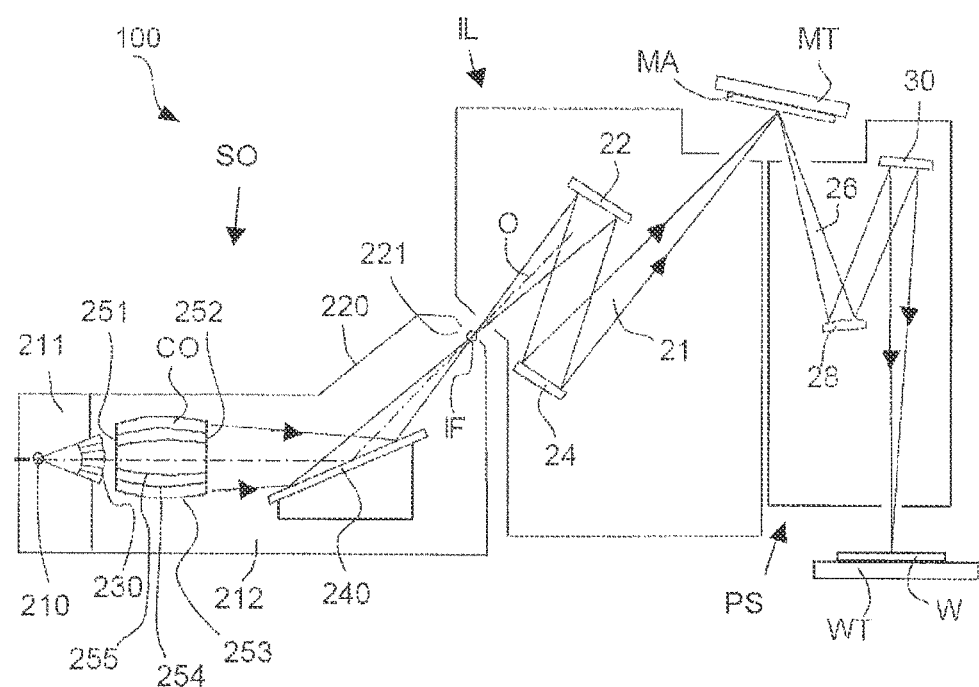
FIG. 12 is a more detailed view of the apparatus in FIG. 11.

FIG. 12 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 12.

Collector optic CO, as illustrated in FIG. 12, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma source, often called a DPP source. Alternatively, the source collector module SO may be part of an LPP radiation system.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

The concepts disclosed herein may be used to simulate or mathematically model any patterning process involving a lithographic apparatus, and may be especially useful with emerging imaging technologies capable of producing wavelengths of an increasingly smaller size. Emerging technologies already in use include deep ultraviolet (DUV) lithography that is capable of producing a 193 nm wavelength with the use of an ArF laser, and even a 157 nm wavelength with the use of a fluorine laser. Moreover, EUV lithography is capable of producing wavelengths within a range of 5-20 nm.

While the concepts disclosed herein may be used for device manufacturing on a substrate such as a silicon wafer, it shall be understood that the disclosed concepts may be used with any type of lithographic imaging systems, e.g., those used for imaging on substrates other than silicon wafers.

The patterning device referred to above comprises or can form a design layout. The design layout can be generated utilizing a CAD (computer-aided design) program. This process is often referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.

a programmable LCD array.

As noted, microlithography is a significant step in the manufacturing of devices such as ICs, where patterns formed on substrates define functional elements of the ICs, such as microprocessors, memory chips etc. Similar lithographic techniques are also used in the formation of flat panel displays, micro-electro mechanical systems (MEMS) and other devices.

The process in which features with dimensions smaller than the classical resolution limit of a lithographic projection apparatus are printed, is commonly known as low-$k_1$ lithography, according to the resolution formula $CD = k_1 \times \lambda / NA$, where $\Delta$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET).

As an example, OPC addresses the fact that the final size and placement of an image of the design layout projected on the substrate will not be identical to, or simply depend only on the size and placement of the design layout on the patterning device. A person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

To help ensure that the projected image of the design layout is in accordance with requirements of a given target circuit design, proximity effects may be predicted and compensated for, using sophisticated numerical models, corrections or pre-distortions of the design layout. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Applying OPC is generally not an "exact science", but an empirical, iterative process that does not always compensate for all possible proximity effect. Therefore, the effect of OPC, e.g., design layouts after application of OPC and any other RET, should be verified by design inspection, i.e. intensive full-chip simulation using calibrated numerical process models, in order to minimize the possibility of design flaws being built into the patterning device pattern. Both OPC and full-chip RET verification may be based on numerical modeling systems and methods.

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. As is known, off-axis illumination, such as annular, quadrupole, and dipole, is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be used. For example, the source can be partitioned into several regions, each of which corresponds to a certain region of the pupil spectrum. Then, the source distribution is assumed to be uniform in each source region and the brightness of each region is optimized for the process window. In another example, a method based on illuminator pixels can be used that converts the source optimization problem into a series of non-negative least square optimizations.

For low $k_1$ photolithography, optimization of both the source and patterning device is useful to ensure a viable process window for projection of critical circuit patterns. Some algorithms discretize illumination into independent source points and the patterning device pattern into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of an apparatus or a device manufacturing process, for example, parameters a user of the lithographic apparatus can adjust, or parameters a user can adjust by adjusting those parameters. It should be appreciated that any characteristics of a device manufacturing process, including those of the source, the patterning device, the projection optics, and/or resist characteristics can be among the design variables in the optimization. The cost function is often a non-linear function of the design variables. Then standard optimization techniques are used to minimize the cost function.

A source and patterning device (design layout) optimization method and system that allows for simultaneous optimization of the source and patterning device using a cost function without constraints and within a practicable amount of time is described in PCT Patent Application Publication No. WO 2010/059954, which is hereby incorporated by reference in its entirety. Another source and mask optimization method and system that involves optimizing the source by adjusting pixels of the source is described in U.S. Patent Application Publication No. 2010/0315614, which is hereby incorporated by reference in its entirety.

The embodiments may further be described using the following clauses:

1. A method comprising:
   obtaining a characteristic of performance of a test pattern in a device manufacturing process;
   determining based on the characteristic whether the test pattern is a hot spot; and
   training, by a hardware computer system, a machine learning model using a training set comprising a sample whose feature vector comprises the characteristic and whose label is whether the test pattern is a hot spot.

2. The method of clause 1, wherein the characteristic comprises a process window of the test pattern in the device manufacturing process.

3. The method of clause 1 or clause 2, wherein the characteristic comprise a characteristic of geometric shape of the test pattern, a density distribution of a pixelated image of the test pattern, a result of functional decomposition of the test pattern, fragmentation of the test pattern, diffraction order distribution of the test pattern, a Bossung curve of the test pattern, or a geometric characteristic of the test pattern.

4. The method of any of clauses 1 to 3, wherein obtaining the characteristic comprises performing a simulation, performing metrology, or performing comparison of the characteristic to empirical data.

5. The method of any of clauses 1 to 4, wherein determining whether the test pattern is a hot spot comprises comparing the characteristic to an overlapping process window of a group of patterns that comprises the test pattern.

6. A method comprising:
   obtaining a plurality of sets of characteristics of performance of a hot spot under a plurality of process conditions in a device manufacturing process, respectively;
   determining, for each of the process conditions, based on the set of characteristics under that process condition, whether the hot spot is defective;
   obtaining characteristics of each of the process conditions; and
   training, by a hardware computer system, a machine learning model using a training set comprising a plurality of samples, wherein each of the samples has a feature vector comprising characteristics of one of the process conditions and a label comprising whether the hot spot is defective under that process condition.

7. The method of clause 6, wherein the characteristics of each of the process conditions comprise focus, dose, a reticle map, moving standard deviation (MSD), or a chemical-mechanical planarization (CMP) heat map.

8. The method of clause 6 or clause 7, wherein the sets of the characteristics of performance comprise a characteristic of an image of the hot spot produced by the device manufacturing process under the respective process condition.

9. The method of any of clauses 6 to 8, wherein determining whether the hot spot is defective comprises comparing a characteristic of performance to a specification for the hot spot.

10. A method comprising:
obtaining a plurality of sets of characteristics of performance of a plurality of hot spots, respectively, under a plurality of process conditions, respectively, in a device manufacturing process;
determining, for each of the process conditions, for each of the hot spots, based on the characteristics under that process condition, whether that hot spot is defective;
obtaining characteristics of each of the process conditions;
obtaining characteristics of each of the hot spots; and
training, by a hardware computer system, a machine learning model using a training set comprising a plurality of samples, wherein each of the sample has a feature vector comprising the characteristics of one of the process conditions and the characteristics of one of the hot spots, the feature vector further comprising a label comprising whether that hot spot is defective under that process condition.

11. The method of clause 10, wherein the sets of the characteristics of the performance comprise a characteristic of an image of the respective hot spot produced by the device manufacturing process under the respective process conditions.

12. The method of clause 10 or clause 11, wherein obtaining the sets of characteristics of performance comprises performing simulation, performing metrology, or performing comparison of characteristics of performance to empirical data.

13. The method of any of clauses 10 to 12, wherein determining whether the hot spot is defective comprises comparing a characteristic of performance of that hot spot to a specification for that hot spot.

14. The method of any of clauses 10 to 13, wherein the characteristics of each of the process conditions comprise focus, dose, a reticle map, moving standard deviation (MSD), or a chemical-mechanical planarization (CMP) heat map.

15. The method of any of clauses 10 to 14, wherein the characteristics of the hot spot comprise a characteristic of geometric shape of the hot spot, a density distribution of a pixelated image of the hot spot, a result of functional decomposition of the hot spot, fragmentation of the hot spot, diffraction order distribution of the hot spot, a Bossung curve for the hot spot, or a geometric characteristic of the hot spot.

16. A method comprising:
simulating, by a hardware computer system, metrology data of hot spots in a design layout, based on one or more characteristics of the hot spots, a simulation model and one or more process conditions;
clustering the hot spots into one or more clusters, based on one or more characteristics of the hot spots and the first simulated metrology data; and
selecting representatives from the one or more clusters, respectively.

17. The method of clause 16, wherein the representative of each of the clusters is a hot spot that is most likely to be defective within that cluster.

18. The method clause 16 or clause 17, further comprising:
forming structures on a substrate from the representatives by subjecting the representatives to a fabrication process under a process condition;
obtaining metrology data from the structures on the substrate; and
obtaining a refined simulation model by tuning one or more parameters of the simulation model, based on the process condition and the metrology data.

19. The method of clause 18, further comprising:
simulating further metrology data of a group of patterns based on one or more characteristics of the patterns, the refined simulation model and one or more process conditions;
obtaining experimental metrology data of the patterns;
determining whether the patterns have any defect based on the experimental metrology data; and
training, by a hardware computer, a classification model using a training set comprising the further simulated metrology data and whether the patterns have any defect.

20. A computer program product comprising a computer readable medium having instructions recorded thereon, the instructions when executed by a computer implementing the method of any of clauses 1 to 19.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. Thus, a lithographic apparatus using the imprint technology typically include a template holder to hold an imprint template, a substrate table to hold a substrate and one or more actuators to cause relative movement between the substrate and the imprint template so that the pattern of the imprint template can be imprinted onto a layer of the substrate.

The descriptions above are intended to be illustrative, not limiting. Thus, it will be apparent to one skilled in the art that modifications may be made as described without departing from the scope of the claims set out below.

What is claimed is:

1. A method comprising:
   obtaining a characteristic representing how a test pattern performs in terms of being made in a device manufacturing process;
   determining based on the characteristic whether the test pattern is a hot spot;
   training, by a hardware computer system, a machine learning model using a training set comprising a sample whose feature vector comprises the characteristic and whose label is whether the test pattern is a hot spot; and
   configuring the device manufacturing process based on the trained machine learning model and/or providing a signal representing, or based on, the trained machine learned model to an apparatus for use by a tool or system in configuring the device manufacturing process.

2. The method of claim 1, wherein the characteristic comprises a process window of the test pattern in the device manufacturing process.

3. The method of claim 1, wherein the feature vector comprises a characteristic of geometric shape of the test pattern, a density distribution of a pixelated image of the test pattern, a result of functional decomposition of the test pattern, fragmentation of the test pattern, diffraction order distribution of the test pattern, a Bossung curve of the test pattern, or a geometric characteristic of the test pattern.

4. The method of claim 1, wherein obtaining the characteristic comprises performing a simulation, performing metrology, or performing comparison of the characteristic to empirical data.

5. The method of claim 1, wherein determining whether the test pattern is a hot spot comprises comparing the characteristic to an overlapping process window of a group of patterns that comprises the test pattern.

6. The method of claim 1, further comprising using the trained machine learning model to configure the device manufacturing process.

7. A computer program product comprising a non-transitory computer readable medium having instructions therein, the instructions, when executed by a computer system, configured to cause the computer system to at least:
   obtain a characteristic representing how or in what manner a test pattern performs in terms of being made in a device manufacturing process;
   determine based on the characteristic whether the test pattern is a hot spot; train a machine learning model using a training set comprising a sample whose feature vector comprises the characteristic and whose label is whether the test pattern is a hot spot; and
   configure the device manufacturing process based on the trained machine learning model and/or provide a signal representing, or based on, the trained machine learned model to an apparatus for use by a tool or system in configuring the device manufacturing process.

8. A method comprising:
   obtaining a machine learning model trained using a training set comprising a sample whose feature vector comprises a performance characteristic representing how or in what manner a test pattern performs in terms of being made in a device manufacturing process and whose label is whether the test pattern is a hot spot determined based on the performance characteristic;
   applying one or more characteristics of a sample pattern to the machine learning model;
   generating, by the machine learning model based on the one or more characteristics of the sample pattern, an output indicating whether the sample pattern is, or has, a hot spot; and
   configuring the device manufacturing process based on the output and/or providing a signal representing, or based on, the output to an apparatus for use by a tool or system in configuring the device manufacturing process.

9. The method of claim 8, wherein the one or more characteristics of the sample pattern comprises a characteristic of geometric shape of the sample pattern, a density distribution of a pixelated image of the sample pattern, a result of functional decomposition of the sample pattern, fragmentation of the sample pattern, diffraction order distribution of the sample pattern, a Bossung curve of the sample pattern, or a geometric characteristic of the sample pattern.

10. The method of claim 8, wherein the output comprises a characteristic of the hot spot, the characteristic of the hot spot comprising a characteristic of geometric shape of the hot spot, a density distribution of a pixelated image of the hot spot, a result of functional decomposition of the hot spot, fragmentation of the hot spot, diffraction order distribution of the hot spot, a Bossung curve for the hot spot, or a geometric characteristic of the hot spot.

11. The method of claim 8, further comprising configuring, based on the output, the device manufacturing process.

12. The method of claim 8, wherein the performance characteristic comprises a process window of the test pattern in the device manufacturing process.

13. The method of claim 8, wherein whether the test pattern is a hot spot is determined by comparison of the performance characteristic to an overlapping process window of a group of patterns that comprises the test pattern.

14. A computer program product comprising a non-transitory computer readable medium having instructions therein, the instructions, when executed by a computer system, configured to cause the computer system to at least:
   obtain a machine learning model trained using a training set comprising a sample whose feature vector comprises a performance characteristic representing how or in what manner a test pattern performs in terms of being made in a device manufacturing process and whose label is whether the test pattern is a hot spot determined based on the performance characteristic;
   apply one or more characteristics of a sample pattern to the machine learning model;
   generate, by the machine learning model based on the one or more characteristics of the sample pattern, an output indicating whether the sample pattern is, or has, a hot spot; and
   configure the device manufacturing process based on the output and/or provide a signal representing, or based on, the output to an apparatus for use by a tool or system in configuring the device manufacturing process.

15. A method comprising:
   obtaining a machine learning model trained using a training set comprising a plurality of samples, wherein each of the samples has a feature vector comprising a respective characteristic of one of a plurality of process conditions and a label comprising whether a hot spot is defective under that process condition;

applying one or more characteristics associated with a sample pattern to the machine learning model;

generating, by the machine learning model based on the one or more characteristics associated with the sample pattern, an output indicating whether the sample pattern is, or has, a hot spot that is defective; and configuring the device manufacturing process based on the output and/or providing a signal representing, or based on, the output to an apparatus for use by a tool or system in configuring the device manufacturing process.

16. The method of claim 15, wherein the one or more characteristics associated with the sample pattern comprises focus, dose, a reticle map, moving standard deviation (MSD), or a chemical-mechanical planarization (CMP) heat map.

17. The method of claim 15, further comprising configuring, based on the output, a device manufacturing process.

18. The method of claim 15, wherein the training set further includes a characteristic of the hot spot, the characteristic of the hot spot comprising a characteristic of geometric shape of a hot spot, a density distribution of a pixelated image of a hot spot, a result of functional decomposition of a hot spot, fragmentation of a hot spot, diffraction order distribution of a hot spot, a Bossung curve for a hot spot, or a geometric characteristic of a hot spot.

19. The method of claim 15, wherein the output is generated by the machine learning model based on a characteristic of a process condition of the sample pattern and based on a characteristic of a hot spot.

20. A computer program product comprising a non-transitory computer readable medium having instructions therein, the instructions, when executed by a computer system, configured to cause the computer system to at least:

obtain a machine learning model trained using a training set comprising a plurality of samples, wherein each of the samples has a feature vector comprising a respective characteristic of one of a plurality of process conditions and a label comprising whether a hot spot is defective under that process condition;

apply one or more characteristics associated with a sample pattern to the machine learning model;

generate, by the machine learning model based on the one or more characteristics associated with the sample pattern, an output indicating whether the sample pattern is, or has, a hot spot that is defective; and configure the device manufacturing process based on the output and/or provide a signal representing, or based on, the output to an apparatus for use by a tool or system in configuring the device manufacturing process.

* * * * *